(12) United States Patent
Itoh et al.

(10) Patent No.: US 7,683,457 B2
(45) Date of Patent: Mar. 23, 2010

(54) GROUP I-VII SEMICONDUCTOR SINGLE CRYSTAL THIN FILM AND PROCESS FOR PRODUCING SAME

(75) Inventors: Tadashi Itoh, Toyonaka (JP); Masaaki Ashida, Ibaraki (JP)

(73) Assignee: Japan Science & Technology Agency, Saitama (JP)

( * ) Notice: Subject to any disclaimer, the term of this patent is extended or adjusted under 35 U.S.C. 154(b) by 0 days.

(21) Appl. No.: 10/589,003

(22) PCT Filed: Nov. 30, 2004

(86) PCT No.: PCT/JP2004/017777

§ 371 (c)(1),
(2), (4) Date: Aug. 10, 2006

(87) PCT Pub. No.: WO2005/078788

PCT Pub. Date: Aug. 25, 2005

(65) Prior Publication Data

US 2007/0090341 A1  Apr. 26, 2007

(30) Foreign Application Priority Data

Feb. 13, 2004 (JP) ............................. 2004-037441

(51) Int. Cl.
*H01L 31/0256* (2006.01)
(52) U.S. Cl. ............................. 257/613; 257/E29.102
(58) Field of Classification Search ........... 257/E29.102
See application file for complete search history.

(56) References Cited

U.S. PATENT DOCUMENTS

| 5,249,250 A * | 9/1993 | Yamada et al. ............... 385/122 |
| 2003/0186013 A1* | 10/2003 | Dhaler et al. ............... 428/40.1 |
| 2004/0191645 A1* | 9/2004 | Taniguchi et al. ............... 430/5 |

(Continued)

FOREIGN PATENT DOCUMENTS

JP  50-157064 A  12/1975

(Continued)

OTHER PUBLICATIONS

R. Stanley Williams, David K. Shuh, Yusaburo Segawa, Growth and luminescence spectroscopy of a CuCl quantum will structure, May/Jun. 1988. Journal of Cauum and Technology, A 6(3), pp. 1950-1952.*

(Continued)

*Primary Examiner*—N Drew Richards
*Assistant Examiner*—Jae Lee
(74) *Attorney, Agent, or Firm*—Nixon & Vanderhye

(57) ABSTRACT

A $CaF_2$ buffer layer (3) is formed on a $CaF_2$ (111) substrate (2) by an MBE method. Furthermore, a CuCl thin film is grown on the $CaF_2$ buffer layer (3) by the MBE method while irradiating it with an electron beam to form an electro beam irradiation film (1a). Subsequently, a CuCl thin film is grown by the MBE method without the irradiation of electron beam to form an electron beam non-irradiation film (1b), thereby thus forming a CuCl thin film (a) including the electron beam irradiation film (1a) and the electron beam non-irradiation film (1b). Consequently, a CuCl thin film (1) exhibiting high planarity and crystallinity can be formed.

11 Claims, 8 Drawing Sheets

U.S. PATENT DOCUMENTS

2005/0150758 A1* 7/2005 Yakshin et al. ......... 204/192.12

FOREIGN PATENT DOCUMENTS

| JP | 63-232311 A | 9/1988 |
|---|---|---|
| JP | 5-194085 A | 8/1993 |
| JP | 5-330822 A | 12/1993 |

OTHER PUBLICATIONS

R. Stanley Williams, David k. Shuh, and Yusaburo Segawa ("Growth and luminescence spectroscopy of a CuCl quantum well structure", American Vacuum Society Journal of Vacuum Science and Technology A 6(3), May/Jun. 1988, pp. 1950-1952.*

Kawamori et al.; Growth of CuCl Nanostructure on CaF2(111) Substrates by MBE-their Morphology and Optical Spectra; (2002), pp. 237-239 and pp. 1915-1619.

Kawamori et al.; Growth of CuCl Nanostructure on CaF2(111) Substrates by MBE-their Morphology and Optical Spectra; (2002), pp. 237-239 and pp. 1615-1619.

M.Takata et al. "MBE growth condition of CuCl thin films and their optical properties" Proceedings of 14th conference of association for condensed matter photophysics, p. 27-30.

M.Takata et al. "Growth of CuCl thin films by electron-beam assisted MBE and their optical properties" International Symposium on the Creation of Novel Nanomaterials Program and Abstracts, p. 117.

S.Yano et al. "Excitonic optical nonlinearity of CuCl microcrystals in a NaCl matrix" J. Appl. Phys. 79 (ii), Jun. 1, 1996, p. 8216-8222.

A.I.Ekimov et al. "Quantum Size Effect in Semiconductor Microcrystals" Solid State Communications, vol. 56, No. 11, 1985, p. 921-924.

T.Itoh et al. "Study on the Size and Shape of CuCl Microcrystals Embedded in Alkali-Chloride Matrices and Their Correlation with Exciton Confinement" Phys. Stat. Sol.(b) 145, 1988, p. 567-577.

G.R.Olbright et al. "Epitaxial Growth and X-Ray Diffraction Analysis of Single-Crystal Thin Films of CuCl" Solid State Communications, vol. 58, No. 6, 1986, p. 337-341.

R.S.Williams et al. "Growth and luminescence spectroscopy of a CuCl quantum well structure" J. Vac. Sci. Technol. A6 (3), May/Jun. 1988, p. 1950-1952.

A.Kahn et al. "Determinants of Surface Atomic Geometry: The CuCl(110) Test Case" Physical Review Letters, vol. 68, No. 21, May 25, 1992, p. 3200-3203.

A Yanase et al. "Heteroepitaxial growth of CuCl on MgO(00 1) substrates" Surface Science Letters 278, 1992, L105L109.

H.Ishihara et al. "Anomalous size dependence of degenerate four-wave mixing due to double resonance of internal field and third-order susceptibility" Physical Review B, vol. 65, 035305, p. 1-9.

K.Cho ""ABC" -Free Theory of Polariton From Semi-Infinite Medium to Quantum Well" Journal of the Physical Society of Japan, vol. 55, No. 11, Nov. 1986, p. 4113-4121.

K.Cho et al. "Theoretical Analysis of Polariton Interference in a Thin Platelet of CuCl. I. Additional Boundary Condition" Journal of the Physical Society of Japan, vol. 54, No. 11, Nov. 1985, p. 4431-4443.

M.Ichimiya et al. "Enhancement of Degenerate Four-Wave Mixing Signal in CuCl Nanostructures with High Crystalline Quality" IQEC/CLEOPR, Technical Digest, JWAB3-PI, Jul. 13, 2005.

M.Ichimya et al. "Ultrafast degenerate four-wave mixing at confined exciton resonance in CuCl ultrathin films with high crystalline quality" Proceeding of Joint Conference on Ultrafast Optics V and Applications of High Field and Short Wavelength Sources XI, W2- 7, Sep. 28, 2005.

M.Ichiniiya et al. "Ultrafast degenerate four-wave mixing in CuCl ultrathin films" Proceedings of the 7th International Conference on Excitonic Processes in Condensed Matter (EXCON 2006), to be published in Physica Status Solidi (C), OPBII, Jun. 29, 2006.

M.Ichimiya et al. "Enhancement of Nonlinear Optical Response in CuCl Nanostructures" 3rd Annual Meeting of Society of Nanao Science and Technology.

M.Hasegawa et al. "Enhancement effect of four-wave mixing signal due to weakly confined excitons in CuCl nanostructures" 15th Annual Meeting of Association for Condensed Matter Photophysics.

M.Ichimiya et al. "Size-resonant enhancement of four-wave mixing signal in CuCi nanostructures" 60th Annual Meeting of the Physical Society of Japan.

M.Hasegawa et al. "CuCl nanostructures on CaF2(111) substrate grown by MBE and their optical properties II" 59th Annual Meeting of The Physical Society of Japan.

A Novel Electron-Beam Exposure Epitaxy for Growing GaAs Films on Fluoride/Si Structures; Lee et al.; Japanese Journal of Applied Physics; vol. 26, No. 11, Nov. 1987, pp. L1834-L1836.

* cited by examiner

F I G. 9
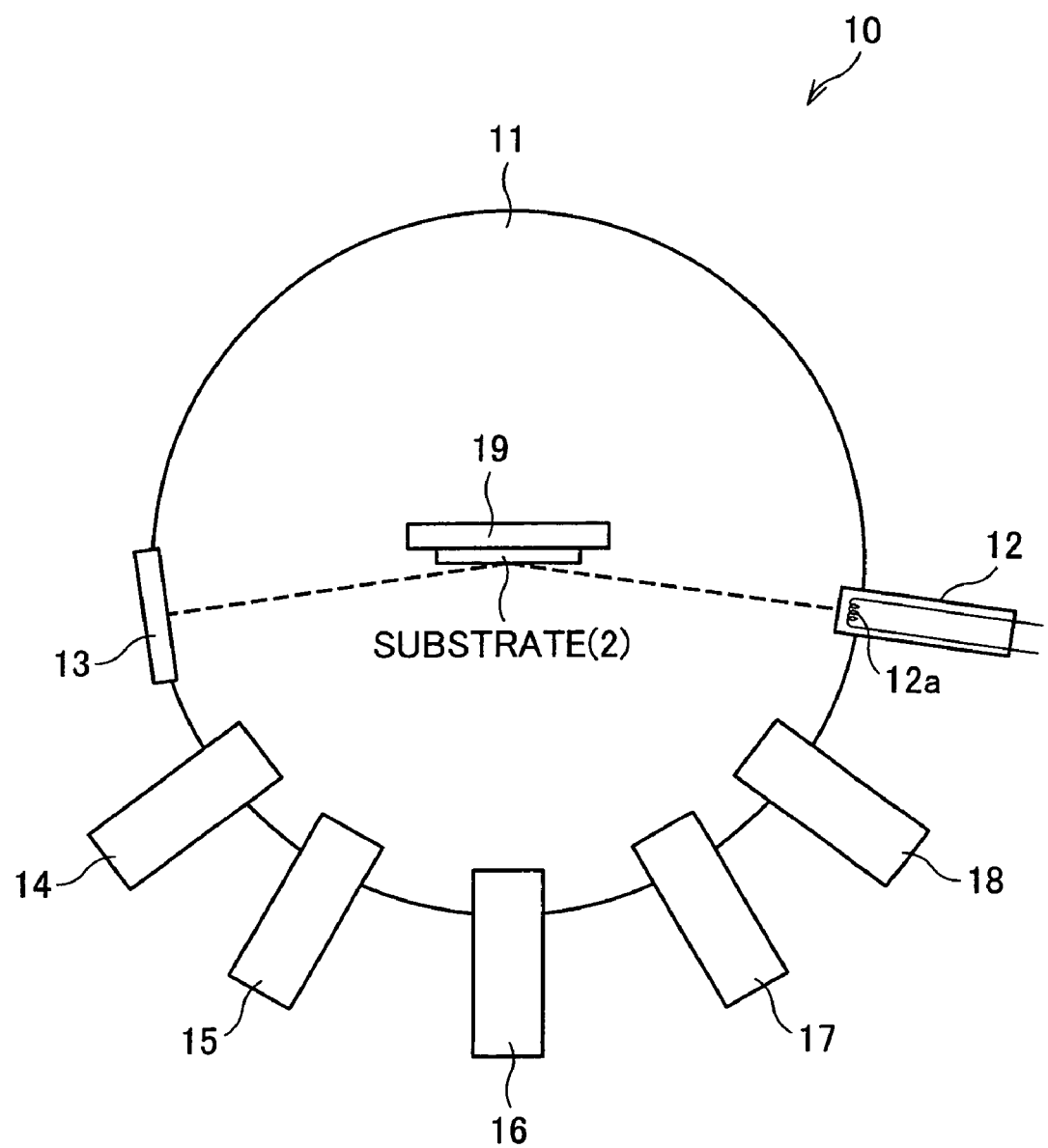

GROUP I-VII SEMICONDUCTOR SINGLE CRYSTAL THIN FILM AND PROCESS FOR PRODUCING SAME

This application is the US national phase of international application PCT/JP2004/017777 filed 30 Nov. 2004, which designated the U.S. and claims priority of JP 2004-037441, filed 13 Feb. 2004, the entire contents of each of which are hereby incorporated by reference.

TECHNICAL FIELD

The present invention relates to a group I-VII semiconductor single crystal thin film and a process for producing the same, and especially to a process for producing a group I-VII semiconductor single crystal thin film, the process including electron beam irradiation during single crystal growth, so that the group I-VII semiconductor single crystal thin film is excellent in planarity and crystallinity.

BACKGROUND ART

The progress in information society draws attention to optical communication technique as a technique that realize high-speed communication. Meanwhile, the optical communication technique has been studied to be improved to attain a faster-speed communication.

A super-high speed optical switch, which switches at a faster speed than conventional optical switches, is inevitable for attaining the faster-speed communication in the optical communication technique. In order to realize such a super-high speed optical switch, it is important to develop a material having a large optical non-linearity and a faster response speed.

Here, the non-linearity is a phenomenon that light irradiation changes absorption coefficient and refractive index of a material on which the light is irradiated. Thus, irradiation of light on a material having optical non-linearity can prevent another light from passing through the material, or change a direction of the another light. That is, the use of the material having optical non-linearity makes it easier to construct an all-opt switch, which controls light by using light.

However, conventionally-known materials having large nonlinear optical responses (optical non-linearity) have slow responding speeds. This hinders practical use of the all-opt switch. That is, a material having a large optical non-linearity and a fast responding speed is necessary to realize an all-opt switch.

Group I-VII semiconductors such as CuCl and the like have drawn attention as such a material having a large optical non-linearity and a fast responding speed. Group I-VII semiconductors (such as CuCl and the like) has a very small Bohr radius of exciton (approximately 0.7 nm), and a very large binding energy of exciton (approximately 200 meV). The very small Bohr radius of exciton and very large binding energy of exciton allow stable exciton state. Because of this, it is expected that optical non-linearity of group I-VII semiconductors becomes higher due to electric field or confinement of excitons. Therefore, optical properties of the group I-VII semiconductors have been extensively studied (see S. Yano, T. Goto, and T. Itoh, J. Appl. Phys. 79(1996) p. 8216).

For example, A. Ekimov, Al. L. Efros, and A. A. Onushchenko, Solid State Commun. 56 (1985) p. 921, and T. Itoh, Y. Iwabuchi and M. Kataoka, Phy. Stat. Sol. B 145 (1988) p. 567, CuCl studied optical properties of a structure in which single crystal particles are embedded in a glass matrix or NaCl matrix. G. R. Olbright and N. Peyghambarian, Solid State Common. 58 (1986) p. 337, R. S. Williams, D. K. Shuh and Y. Segawa, J. Vac. Sci. Technol. A6 (1988) p. 337, A. Kahn, S. Ahsan, W. Chen and M. Damas, Phys. Rev. Lett. 68 (1992) p. 3200, and A. Yanase, Y. Segawa, Surf. Sci. 278 (1992) L105 examined surface morphology and optical properties of CuCl epitaxial growth on various substrates such as NaCl (001) substrate, $CaF_2$ (111) substrate, GaP (110) substrate, MgO (001) substrate, and the like.

Furthermore, recently it is theoretically predicted (see H. Ishihara, T. Amakata, K. Cho, Phys. Rev. B65, 2001, 035305) that a CuCl thin film (CuCl nano structure) having a nano-level planarity has a large optical linearity due to an internal electric field that is resonance-increased when the CuCl thin film has a particular size (film thickness of 26 nm). The prediction expects that wavelength of light coupled with electrons would be very short in the crystals and be interfered with even the film thickness of nano scales, and the interference would result in the increase in the internal electric field when the film has a film thickness that is near a particular film thickness. The particular film thickness that causes the resonance-increase of the internal electric field is unique to each material. It is expected that the value of the particular film thickness of a material be determined depending on contribution of the electronic resonance order in the material or dielectric constant of the material.

In view of this, there is a demand for a technique for producing, from a group I-VII semiconductor, a single crystal thin film that is excellent in planarity and crystallinity.

However, it is difficult to produce a single crystal thin film having a nano-level planarity (nano structure) from a group I-VII semiconductor such as CuCl or the like. That is, a technique has not been realized conventionally, which control a size, shape, planarity, and exciton attenuation constant in a thin film made from a group I-VII semiconductor such as CuCl or the like.

For example, a molecular beam epitaxy (MBE) method has been established as a method for producing a nano structure from a group III-V semiconductor, but not for a group II-VI semiconductor and a group I-VII semiconductor.

Group II-VI semiconductors and group I-VII semiconductors are more ionic than the group III-V semiconductors, thereby making it difficult to use the MBE method for the group II-VI semiconductors and group I-VII semiconductors. That is, in order to produce, on an ionic single crystal substrate, a flat single crystal thin film (flat single crystal super thin film) in a nano thickness from a group I-VII semiconductor, which is an ionic semiconductor, it is necessary to establish a technique different from the III-V semiconductor crystal growth which is applied for III-V semiconductor having a strong covalent bond.

DISCLOSURE OF INVENTION

The present invention is attained in view of the above problem. An object of the present invention is to provide a group I-VII semiconductor single crystal thin film and a process for producing the same, the group I-VII semiconductor single crystal thin film having high planarity and crystallinity.

A group I-VII semiconductor single crystal thin film according to the present invention is a group I-VII semiconductor single crystal thin film formed on a substrate made from ionic single crystals. In order to attain the object, the group I-VII semiconductor single crystal thin film according to the present invention is arranged such that the group I-VII semiconductor single crystal thin film is formed on a buffer layer while an electron beam is irradiated on the group I-VII semiconductor single crystal thin film, the buffer layer being for alleviating distortion caused due to a difference in lattice constant between the substrate and the group I-VII semiconductor single crystal thin film. Here, the ionic single crystals are a single crystal material such as ionic crystal (formed by ionic bonding), oxides such as sapphire, quarts, etc.

The group I-VII semiconductor single crystal thin film with this arrangement has a surface improved in planarity and crystallinity compared with a group I-VII semiconductor single crystal thin film formed in a conventional manner without the electron beam irradiation. It is deduced that the electron beam irradiation during the growth of the group I-VII semiconductor single crystal causes the thin film to grow under electron excited state, that is, a covalent bond state (or a state similar to the covalent bond state). Thus, it is possible to realize a semiconductor film having a large optical non-linearity and a fast response speed.

Moreover, with this arrangement, the buffer layer makes it possible to alleviate the distortion caused due to the difference in the lattice constants between the substrate and the I-VII semiconductor single crystal thin layer. Further, the group I-VII semiconductor single crystal thin film can be improved in quality by concentrating defects in the buffer layer.

Moreover, a group I-VII semiconductor single crystal thin film according to the present invention may include: a layer formed while irradiating an electron beam thereon; and a layer formed while not irradiating the electron beam thereon.

It is possible to attain a group I-VII semiconductor single crystal thin film having high planarity with this arrangement in which the group I-VII semiconductor single crystal thin film includes the layer formed while irradiating the electron beam thereon and the layer formed while not irradiating the electron beam thereon. There is an optimum film thickness for the film to be grown with the electron beam irradiation with respect to the film thickness (whole film thickness) of the group I-VII semiconductor single crystal thin film. Thus, it is possible to improve the group I-VII semiconductor single crystal thin film in its surface planarity by deciding the film thicknesses of the films to be grown with and without the electron beam irradiation in consideration with the film thickness (whole film thickness) of the group I-VII semiconductor single crystal thin film.

Moreover, the film thickness of the group I-VII semiconductor single crystal thin film may have a film thickness that allows an internal electric field to be resonance-increased.

It is theoretically predicted that the internal electric field in the group I-VII semiconductor single crystal thin film resonance-increases with a particular film thickness. That is, it is possible to realize a group I-VII semiconductor single crystal thin film having very large optical non-linearity and very fast response speed by giving the group I-VII semiconductor single crystal thin film a film thickness that allows the internal electric field to be resonance-increased.

Moreover, the group I-VII semiconductor single crystal thin film may include (a) a region formed while irradiating an electron beam thereon and (b) a region formed while not irradiating the electron beam thereon, when viewing the substrate in a direction vertical to its surface.

With this arrangement, it is possible to form the group I-VII semiconductor single crystal thin film arbitrarily surface-modifying one portion and not surface-modifying the other portion of the group I-VII semiconductor single crystal thin film. In other words, it is possible to form, on one substrate, group I-VII semiconductor single crystal thin films having different properties.

Moreover, the group I-VII semiconductor single crystal thin film may be a CuCl thin film, or a metal halide semiconductor thin film.

Excitons of these group I-VII semiconductors have very small Bohr radius and very large binding energy. Therefore, a stable exciton state can be obtained. Moreover, electric field and confinement of excitons give a large optical non-linearity.

A process according to the present invention is a process for producing a group I-VII semiconductor single crystal thin film on a substrate made from ionic single crystals. In order to attain the object, the process according to the present invention includes forming a buffer layer on the substrate, the buffer layer being for alleviating distortion caused due to a difference in lattice constant between the substrate and the group I-VII semiconductor single crystal thin film; and forming the group I-VII semiconductor single crystal thin film while irradiating an electron beam on the buffer layer.

According to the process, it is possible to attain significantly better surface planarity and crystallinity compared with a conventional process for producing a group I-VII semiconductor single crystal thin film without the electron beam irradiation. Thus, it is possible to realize a semiconductor thin film having a large optical linearity and a fast response speed.

Moreover, the buffer layer makes it possible to alleviate the distortion caused due to the difference in the lattice constants between the substrate and the I-VII semiconductor single crystal thin layer. Further, the group I-VII semiconductor single crystal thin film can be improved in quality by concentrating defects in the buffer layer.

A process according to the present invention for producing a group I-VII semiconductor single crystal thin film may include: forming a layer of the group I-VII semiconductor single crystal thin film while irradiating an electron beam thereon; and forming the rest of the group I-VII semiconductor single crystal thin film while not irradiating the electron beam thereon.

It is possible to attain a CuCl thin film having high planarity with this arrangement in which the group I-VII semiconductor single crystal thin film includes the layer formed while irradiating the electron beam thereon and the layer formed while not irradiating the electron beam thereon.

The layer formed while irradiating the electron beam thereon and the layer formed while not irradiating the electron beam thereon may have film thicknesses that are decided in consideration of a film thickness of the group I-VII semiconductor single crystal thin film.

There is an optimum film thickness for the film to be grown with the electron beam irradiation with respect to the film thickness of the group I-VII semiconductor single crystal thin film. Thus, it is possible to improve the group I-VII semiconductor single crystal thin film in its surface planarity by deciding the film thicknesses of the films to be grown with and without the electron beam irradiation in consideration with the film thickness (whole film thickness) of the group I-VII semiconductor single crystal thin film.

Moreover, the film thickness of the group I-VII semiconductor single crystal thin film may have a film thickness that allows an internal electric field to be resonance-increased.

With this arrangement, it is possible to realize a group I-VII semiconductor single crystal thin film having very large optical non-linearity and very fast response speed.

The process according to the present invention is preferably arranged such that an acceleration voltage HV of the electron beam is $0(kV) < HV \leq 30 (kV)$.

Electron beam irradiation with an acceleration voltage HV larger than 30 kV would possibly cause poor quality of the group I-VII semiconductor single crystal thin film. The arrangement in which the acceleration voltage HV of the electron beam is 0 (kV)<HV≦30 (kV) allows to produce a group I-VII semiconductor single crystal thin film of high planarity without causing a poor quality.

The process according to the present invention may be arranged such that a filament current FI of the electron beam is 0 (A)<FI≦5 (A).

Electron beam irradiation with a filament current FI larger than 5 A would possibly cause poor quality of the group I-VII semiconductor single crystal thin film. The arrangement in which the filament current FI of the electron beam is 0 (A)<FI≦5 (A) allows to produce a group I-VII semiconductor single crystal thin film of high planarity without causing a poor quality.

The process according to the present invention may be arranged such that an irradiation current HI of the electron beam is 0 (μA)<HI≦150 (μA).

Electron beam irradiation with an irradiation current HI larger than 150 μA would possibly cause poor quality of the group I-VII semiconductor single crystal thin film. The arrangement in which the irradiation current HI of the electron beam is 0 (μA)<HI≦150 (μA) allows to produce a group I-VII semiconductor single crystal thin film of high planarity without causing a poor quality.

For a fuller understanding of the nature and advantages of the invention, reference should be made to the ensuing detailed description taken in conjunction with the accompanying drawings.

BRIEF DESCRIPTION OF DRAWINGS

FIG. 9 is a plane view schematically illustrating a configuration of a thin film producing apparatus used in the production of the CuCl thin film in one Example of the present invention.

BEST MODE FOR CARRYING OUT THE INVENTION

The present invention is described in further details referring to Examples, to which the present invention is not limited.

Example 1

Figure 1:
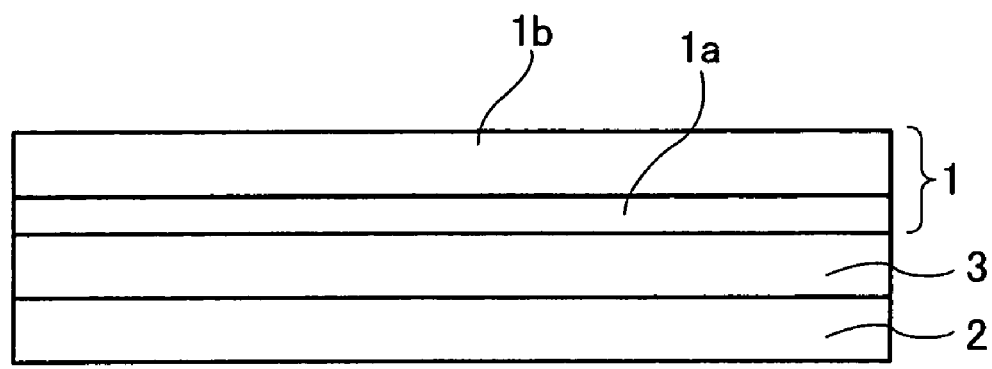
FIG. 1 is a cross sectional view of a substrate on which a group I-VII semiconductor single crystal thin film according to the present invention is formed.

One Example of the present invention is explained below referring to drawings. FIG. 1 is a cross sectional view illustrating a configuration of a substrate (on $CaF_2$ (111) substrate 2) 2 on which a CuCl thin film 1 was formed. The CuCl thin film 1 was a group I-VII semiconductor single crystal thin film according to the present Example of the present invention.

As illustrated in FIG. 1, the CuCl thin film 1 according to the present Example included an electro beam irradiation film 1a and an electron beam-notirradiated film 1b. The electro beam irradiation film 1a was formed while an electron beam was being irradiated thereon, whereas the electron beam-notirradiated film 1b was formed while no electron beam was being irradiated thereon. Moreover, the CuCl thin film 1 was formed on a $CaF_2$ buffer layer (buffer layer) 3 formed on the $CaF_2$ (111) substrate 2. The CuCl and $CaF_2$ have different crystal structures: zincblende type structure and fluorite type structure. However, lattice mismatch between the zincblende type structure and fluorite type structure was approximately 1% (lattice constants of CuCl and $CaF_2$ are respectively 0.5406 nm and 0.5463 nm). Because the lattice mismatch was so small, it was still possible to grow the CuCl thin film on the $CaF_2$ substrate by epitaxial growth.

A process for producing the CuCl thin film 1 is described below.

To begin with, the $CaF_2$ (111) substrate 2 was thermally cleaned at 650° C. for 1 hour, thereby removing impurity such as natural oxidation film attached on a surface thereof.

Then, the $CaF_2$ (111) substrate 2 was heated to a substrate temperature of 600° C., and then the $CaF_2$ buffer layer 3 was grown to 50 nm film thickness at a growth rate of 0.065 nm/s by an MBE method.

FIG. 9 is a plane view schematically illustrating a configuration of a thin film forming apparatus 10 used for producing the CuCl thin film 1. As illustrated in FIG. 9, the thin film forming apparatus 10 is provided with a vacuum vessel 11, an electron beam irradiating apparatus 12, a Reflection High Energy Electron Diffraction (REED) pattern detector 13, gas emitting sections 14 to 18, and a substrate holder 19.

The vacuum vessel 11 can keep the inside thereof under vacuum. The substrate holder 19 is provided in the vacuum vessel 11. The substrate holder 19 is provided for holding the substrate (in the present embodiment, $CaF_2$ (111) substrate 2) on which the thin film is to be formed.

The electron beam irradiating apparatus 12 is provided with a filament 12a. A voltage from power source means (not illustrated) is applied across the filament 12a, thereby flowing a filament current FI across the filament 12a so as to irradiate the electron beam on the substrate held by the substrate holder 19. An irradiation current HI of the electron beam is varied according to an acceleration voltage HV and the filament current FI.

The Reflection High Energy Electron Diffraction pattern detector 13 detects a pattern of the electron beam that is reflected from the substrate on which it is irradiated from the electron beam irradiating apparatus 12, the substrate being held by the substrate holder 19.

The gas emitting sections 14 to 18 are nozzles for emitting gases that are necessary for forming the thin film by the MBE method. That is, the respective gases necessary for the thin film formation are respectively emitted from the gas emitting sections 14 to 18. Each gas emitting sections 14 to 18 is provided with a shutter (not illustrated) respectively, so that a shutter of the gas emitting section is opened when the gas emitting section emits the gas.

On the surface of the $CaF_2$ buffer layer 3 thus formed, streaks of the Reflection High Energy Electron Diffraction (RHEED) pattern appeared clearly. This proved that the surface of the $CaF_2$ buffer layer 3 is flat.

After that, the growth of the $CaF_2$ buffer layer 3 was stopped. Then, the substrate temperature was reduced to 180° C., and then the CuCl thin film 1 of 65 nm film thickness was formed by the MBE method, the CuCl thin film 1 including the electro beam irradiation film 1a of 13 nm film thickness and the electro beam non-irradiation film 1b of 52 nm film thickness. That is, 13 nm of the CuCl thin film 1 was grown with the electron beam irradiation initially in the CuCl growth, and then the remaining 52 nm of the CuCl thin film 1 was grown without the electron beam irradiation. The CuCl growth was carried out with the acceleration voltage HV of 15 kV for the electron beam, the filament current FI of 2.5 A, and the irradiation current of 25 µA. Further, the CuCl thin film 1 was grown at the growth speed of 0.065 nm/s both for the electro beam irradiation film 1a and the electro beam non-irradiation film 1b.

Figure 2:
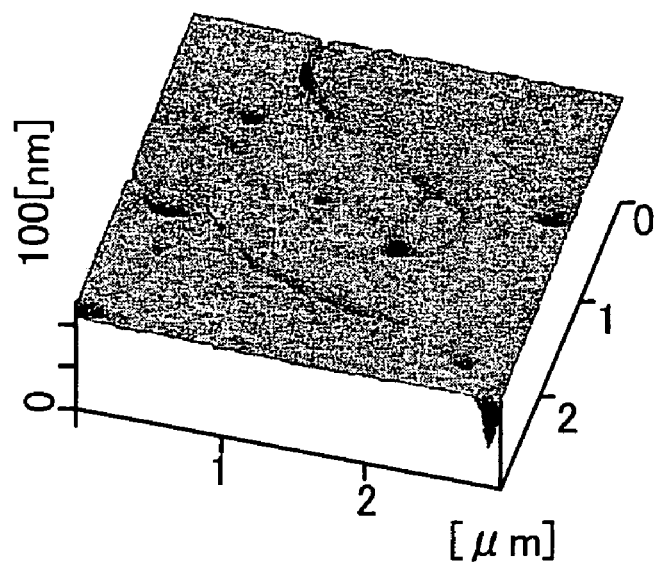
FIG. 2 is an AFM image of a surface of a CuCl thin film according to an Example of the present invention.
Figure 3:
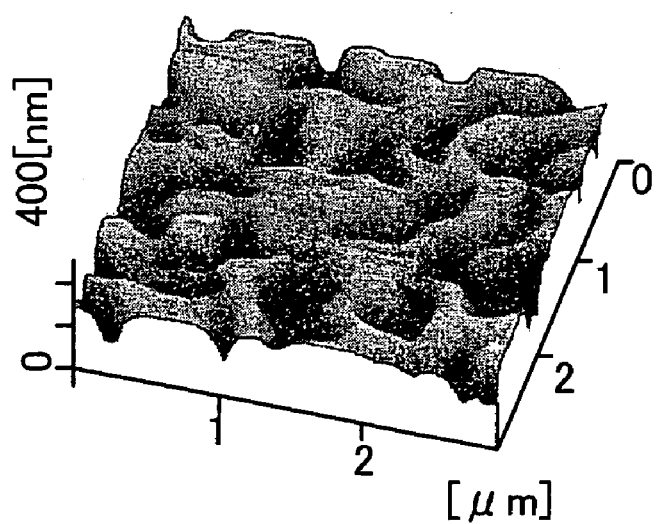
FIG. 3 is an AFM image on a surface of a CuCl thin film formed in 65 nm film thickness without electron beam irradiation.

The results of examination of the properties of the CuCl film 1 thus formed are described. FIG. 2 is a Atomic Force Microscope (AFM) image of the CuCl thin film 1. Moreover, FIG. 3 is an AFM image of a CuCl thin film that was formed in a similar manner to the formation of the CuCl thin film 1, but without electron beam irradiation. That is, FIG. 3 is an AFM image of a CuCl film of 65 nm film thickness formed on the $CaF_2$ buffer layer 3 by the MBE method with the substrate temperature of 180° C. and at the growth rate of 0.065 nm/s, the $CaF_2$ buffer layer 3 being formed on the $CaF_2$ (111) substrate 2.

As illustrated in FIG. 3, the Cucl film formed without the electron beam irradiation had a surface having grooves and holes in the order of 150 nm in depth. On the other hand, as illustrated in FIG. 2, the CuCl film 1 according to the present Example has a surface that was mainly flat even though it had some grooves and holes. The flat portion of the surface of the CuCl film 1 according to the present Example is so flat that its roughness was in the order of 2 nm. This proves that the electron beam irradiation during its formation made the CuCl thin film 1 highly excellent in planarity.

Figure 4:
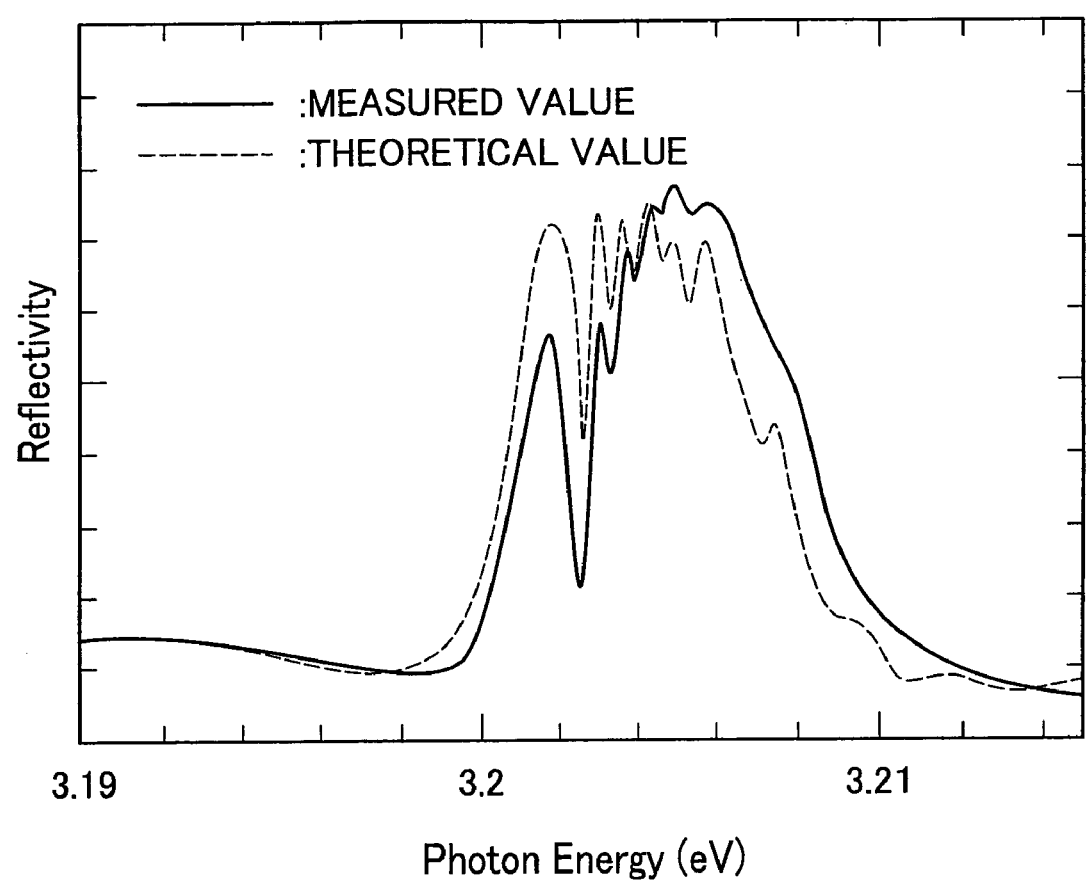
FIG. 4 is a graph illustrating reflection spectrum measurement results and theoretical calculation results of the CuCl thin film according to the Example of the present invention.

Reflection spectrum of the CuCl film 1 was measured. The measurement of the reflection spectrum was carried out under an atmosphere of absolute temperature of 3.6K with a halogen lamp as a light source. FIG. 4 is a graph illustrating the results (indicated by the solid line in FIG. 4) of the measurements of the reflection spectrum of the CuCl thin film 1, and a theoretically-calculated reflection spectrum (indicated by the dotted line in FIG. 4) of the CuCl thin film 1.

The theoretical calculation used ABC-Free theory that utilizes the contribution of $Z_3$ (n=1) exciton order (see K. Cho, J. Phys. Soc. Jpn. 55, 1986, p. 4113). More specifically, based on the ABC-Free theory, the results of the measurements were compared with an assumptive three-layered structure of CuCl (active) layer/CuCl inactive layer/$CaF_2$ layer so as to estimate a film thickness and attenuation multiplier factor.

As illustrated in FIG. 4, the results of the measurements of the reflection spectrum matched well with the theoretical calculation calculated assuming that the resonance portion (CuCl layer) of the CuCl thin film was 58 nm in thickness, a backside optical active layer (CuCl inactive layer) was 17 nm in thickness, the attenuation multiplier factor in an energy region of an energy of $E_T$ or less was $\Gamma_0$=0.1 meV, the attenuation multiplier factor in an energy region of an energy of $E_T$ or more increased linearly and reached 6 $\Gamma_0$ at 3.215 meV. Here, the CuCl inactive layer is a region in which large distortion and many defects occurred due to the lattice mismatching between the substrate and CuCl. Moreover, $E_T$ is an energy level at which the resonance occurs. Theoretically, $E_T$ depends on the film thickness. Moreover, the attenuation multiplier factor corresponds to a width of absorption line.

This explained that the CuCl thin film 1 formed as above was an optically excellent CuCl thin film with a small attenuation multiplier factor.

Next, an emission spectrum of the CuCl thin film 1 was measured. The measurement of the emission spectrum was carried out under an atmosphere of absolute temperature of 3.6K using a He—Cd laser (exciting wavelength of 325 nm) as an exciting light source.

Figure 5:
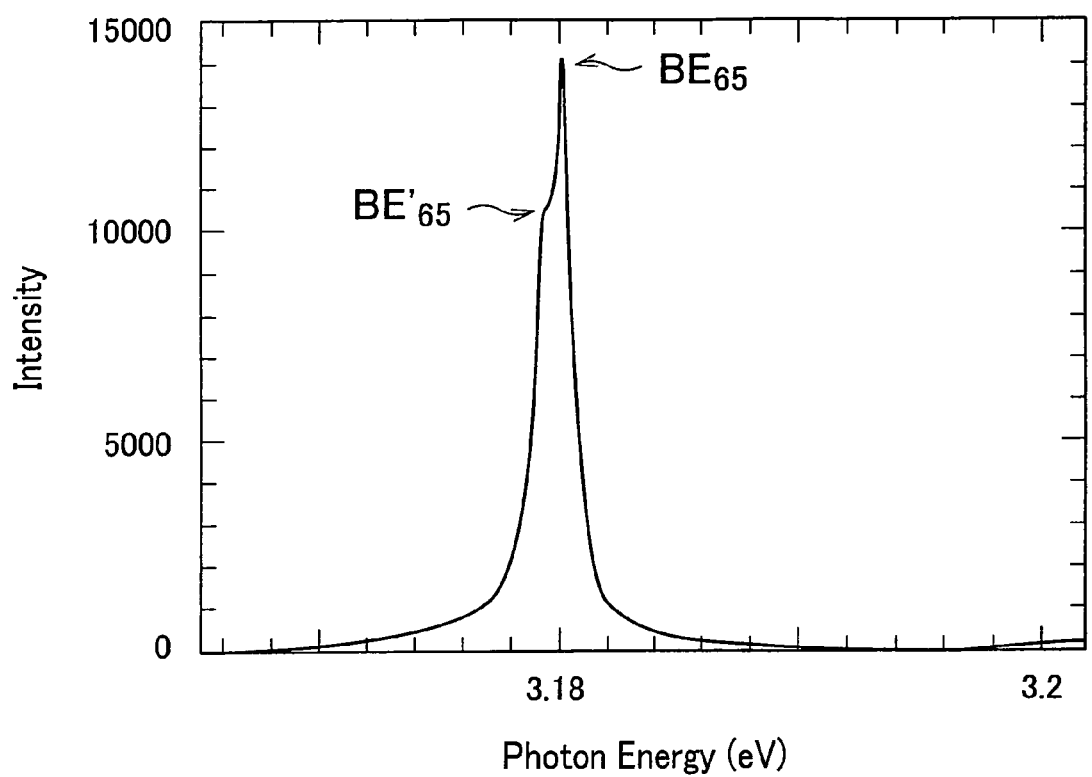
FIG. 5(a) is a graph illustrating emission spectrum measurement results of the CuCl thin film according to the Example of the present invention.
FIG. 5(b) is a graph illustrating emission spectrum measurement results of a CuCl thin film formed without electron beam irradiation.
Figure 5:
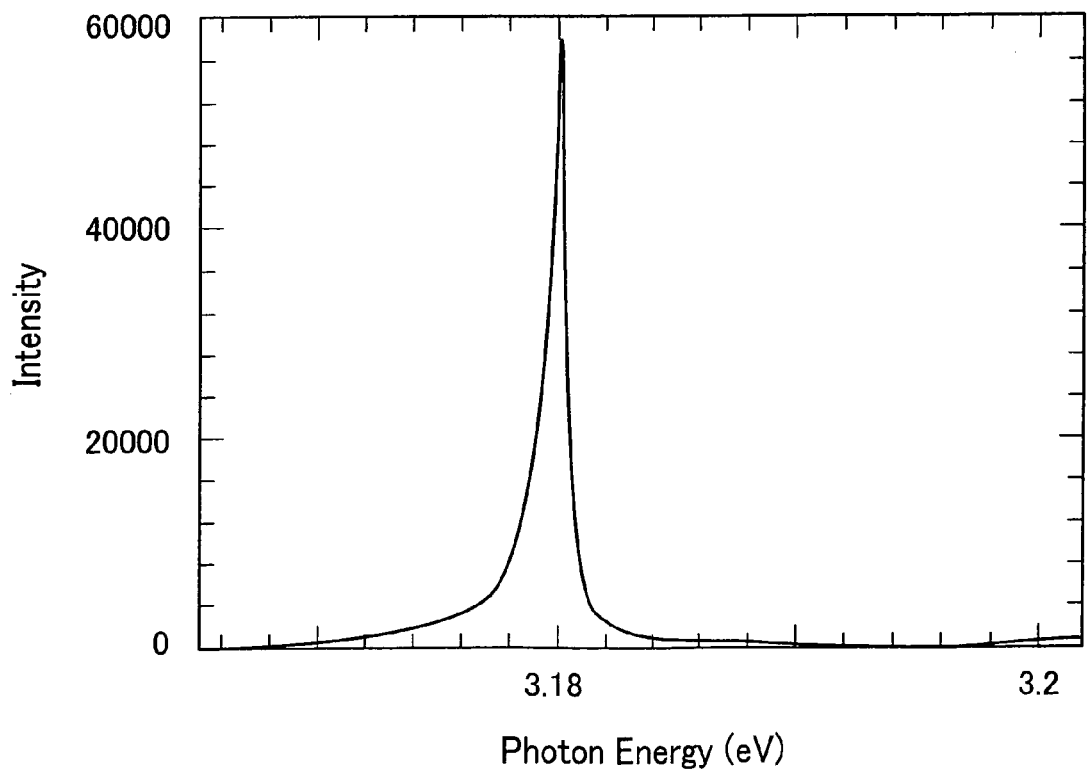

FIG. 5(a) is a graph illustrating the results of the emission spectrum measurements for the CuCl thin film 1. Moreover, FIG. 5(b) is a graph illustrating the results of emission spectrum measurement for the CuCl thin film of 65 nm in thickness formed without the electron beam irradiation.

As illustrated in FIG. 5(b), only one light emitting sharp peak due to the bound excitons was observed in the CuCl thin film formed without the electron beam irradiation. On the other hand, as illustrated in FIG. 5(a), the CuCl thin film 1 showed a "shoulder" ($BE'_{65}$ in FIG. 5(a)) on the left side of the emission peak ($BE_{65}$ in FIG. 5(a)) due to the bound excitons. That is, the CuCl thin film 1 formed with the electron beam irradiation showed the new peak $BE'_{65}$ due to bound excitons on the lower-energy side of the emission peak $BE_{65}$ due to the bound excitons. It is considered that the new peak $BE'_{65}$ appeared due to excitons trapped in defects caused by the electron beam irradiation.

As described above, the process of the present Example for producing the CuCl thin film 1 can improved the resultant CuCl thin film 1 such that the CuCl thin film can have a surface whose roughness is reduced to the order of 2 nm, on the contrary that the conventional CuCl thin film, produced by the conventional method in which no electron beam irradiation is performed, has a surface whose roughness is several nm to several tens nm. Thus, an excellent super flat single crystal film can be attained according to the process of the present Example. It is considered that the electron beam irradiation during the CuCl single crystal growth puts the growing thin film in an electron excited state, that is, covalent bond state (or a state similar to the covalent bond state).

Therefore, according to the process of the present Example for producing the CuCl thin film 1, it is possible to realize the CuCl thin film 1 that is excellent in planarity and crystallinity. Thus, it is possible to realize a semiconductor thin film having a large optical non-linearity and a fast response speed. Because of this, for example, there is a possibility of realizing an all-opt switch that controls light by using light.

In terms of the electron beam irradiation conditions, the present invention is not limited to the electron beam irradiation conditions in the present Example in which the acceleration voltage HV was 15 kV, the filament current FI was 2.5 A, and the irradiation current HI was 25 µA.

However, if the acceleration voltage of the electron beam was excessively high, or if the filament current or the irradiation current was excessively strong, the resultant sample (CuCl film (group I-VII semiconductor single crystal thin film)) would be poor in quality. More specifically, if the acceleration voltage HV was higher than 30 kV, if the filament current FI was greater than 5 A, or if the irradiation current HI was greater than 150 µA, the electron beam irradiation would cause the resultant CuCl film (group I-VII semiconductor signal crystal thin film) to be poor in quality, thereby resulting in poor planarity adversely.

Therefore, it is preferable that the electron beam irradiation conditions be such that $0 \text{ kV} < \text{HV} \leq 30 \text{ kV}$, $0 \text{ A} < \text{FI} \leq 5 \text{ A}$, and $0 \text{ µA} < \text{HI} \leq 150 \text{ µA}$. These electron beam irradiation conditions make it possible to produce a CuCl film (group I-VII semiconductor single crystal thin film) that is excellent in planarity, without causing poor quality in the CuCl film (group I-VII semiconductor single crystal thin film).

Moreover, the electron beam irradiation conditions are easy to apply in well-known electron beam irradiating apparatuses. Thus, it is possible to use a well-known electron beam irradiating apparatus when the electron beam irradiation conditions are applied. This allows to produce a CuCl film (group I-VII semiconductor single crystal thin film) that is excellent in planarity, without increasing facility cost or development cost for equipments.

Example 2

Another Example of the present invention is described referring to drawings.

CuCl thin films (6 samples later described) were formed on a $CaF_2$ buffer layer ($CaF_2$ buffer layer) 3 of 50 nm approximately in thickness on a $CaF_2$ (111) substrate 2, like the CuCl thin film 1 of Example 1. However, the CuCl thin films according to the present Example were configured to have a film thickness of approximately 30 nm at which an internal electric field is expected to resonance-increase most significantly. The CuCl thin films in the present Example were produced in the same manner as in Example 1, except that the CuCl thin film in the present Example was produced to have the film thickness different from that of the CuCl thin film 1 in Example 1.

In the present embodiment, 6 samples were prepared by growing films different in film thickness (electron beam irradiation film thickness), namely 0 nm, 6 nm, 12 nm, 15 nm, 18 nm, and 30 nm, while irradiating an electron beam thereon initially in the CuCl thin film growth. That is, the following CuCl thin films were prepared: a CuCl thin film 10 produced by forming CuCl in thickness of approximately 30 nm without irradiating the electron beam thereon; a CuCl thin film 11 having an electro beam irradiation film of approximately 6 nm in thickness; a CuCl thin film 12 having an electro beam irradiation film of approximately 12 nm in thickness; a CuCl thin film 13 having an electro beam irradiation film of approximately 15 nm in thickness; a CuCl thin film 14 having an electro beam irradiation film of approximately 18 nm in thickness; and a CuCl thin film 15 produced such that its whole 30 nm thickness was formed while irradiating the electron beam thereon.

Moreover, the electron beam irradiation was performed in the same manner as in Example 1, that is, with an acceleration voltage HV of 15 kV, a filament current FI of 2.5 A, and an irradiation current of 25 µA. Note that the present invention is not limited to the above electron beam irradiation conditions. However, as in Example 1, it is preferable that the electron beam irradiation conditions be such that $0 \text{ kV} < \text{HV} \leq 30 \text{ kV}$, $0 \text{ A} < \text{FI} \leq 5 \text{ A}$, and $0 \text{ µA} < \text{HI} \leq 150 \text{ µA}$.

The surfaces of the CuCl thin films 10 to 15 thus prepared as above were observed using an atomic force microscope. The CuCl thin film 10 prepared without the electron beam irradiation had a surface whose roughness was the order of 80 nm and which had no flat portion.

The CuCl thin films 11, 12, and 13 respectively having 6 nm, 12 nm, and 15 nm electro beam irradiation film thickness had surfaces whose roughness was the order of 2 nm, and grooves and holes were the order of 40 nm in depth at most. The CuCl thin films 11 to 13 showed wider flat portions and smaller density of grooves and holes with the greater electron beam irradiation film thickness.

Moreover, with the electron beam irradiation film thickness of 18 nm or greater, the density of the grooves and holds on the surface of the samples was gradually increased.

Figure 6A:
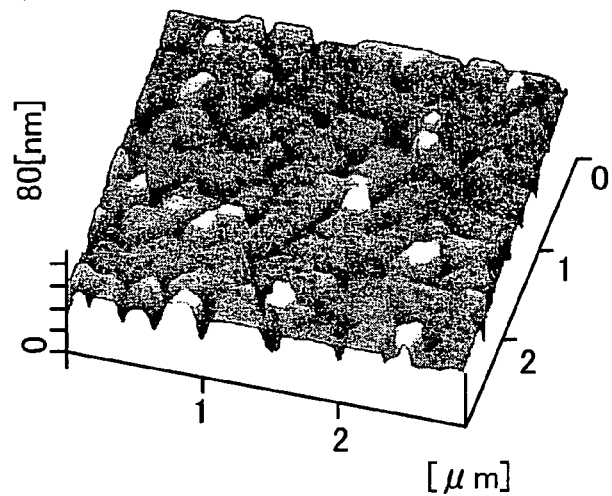
FIG. 6(a) is an AFM photo of a surface of CuCl thin film having a whole film thickness of approximately 30 nm and an electro beam irradiation film thickness of 12 nm.
Figure 6B:
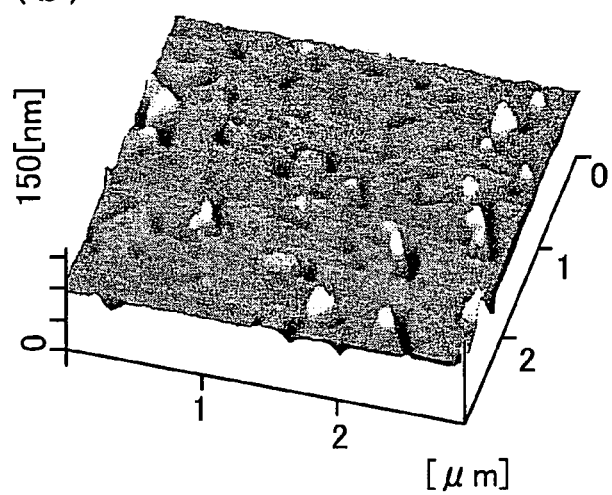
FIG. 6(b) is an AFM photo of a surface of a CuCl thin film having a whole film thickness of approximately 30 nm and an electro beam irradiation film thickness of 15 nm.
Figure 6C:
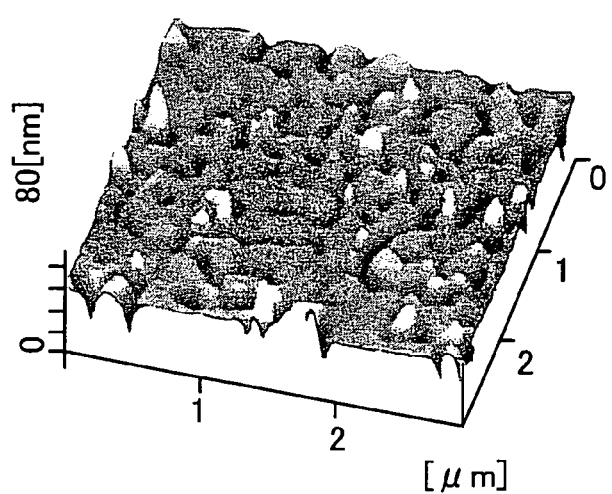
FIG. 6(c) is an AFM photo of a surface of a CuCl thin film having a whole film thickness of approximately 30 nm and an electro beam irradiation film thickness of 18 nm.

FIGS. 6(a) to 6(c) illustrate AFM images of the surfaces of the samples (CuCl thin films 12 to 14) in which the films of 12 nm, 15 nm, and 18 nm in thickness were formed while the electron beam was irradiated thereon.

The observation of the AFM images of the CuCl thin films illustrated in FIGS. 6(a) to 6(c) showed that there is a most suitable electron beam irradiation film thickness for forming a CuCl thin film of approximately 30 nm in thickness. It was found that the most suitable electron beam irradiation film thickness under the growth conditions in the present Example is 15 nm.

Figure 7:
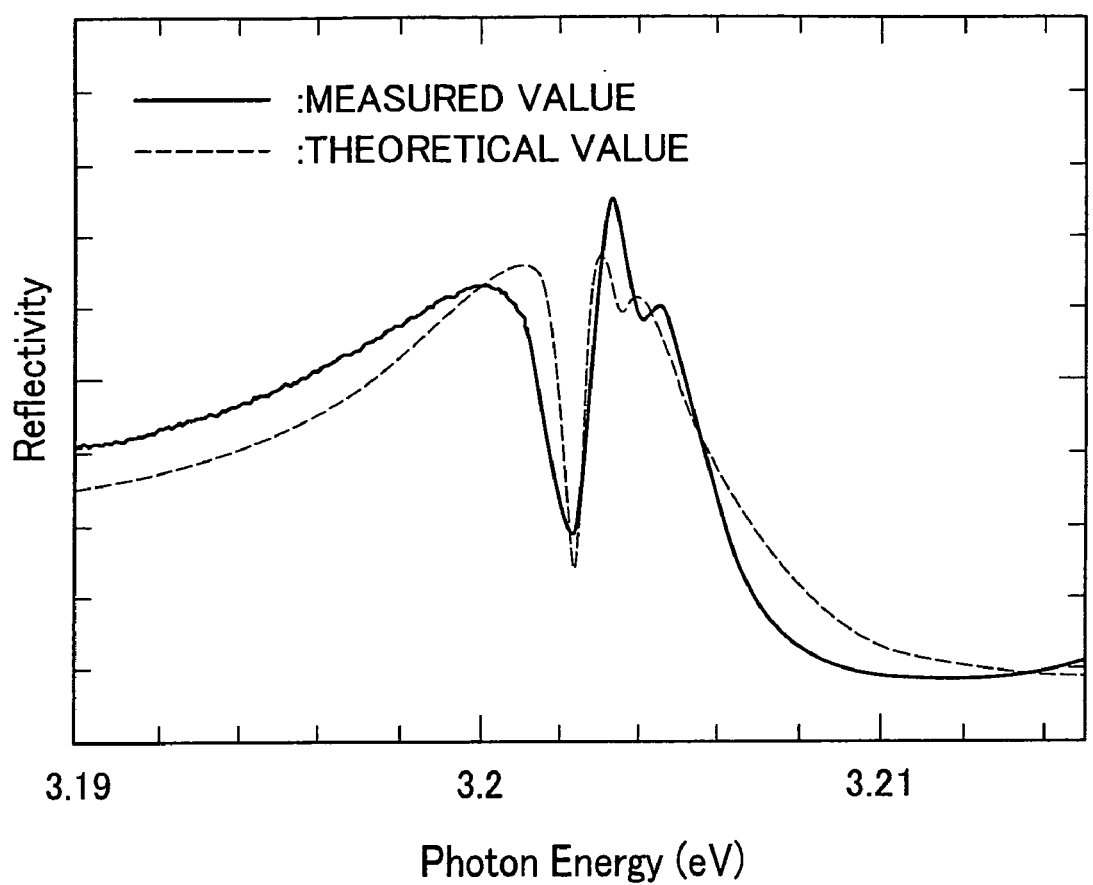
FIG. 7 is a graph illustrating reflection spectrum measurement result and theoretical calculation results for a CuCl thin film according to another Example of the present invention.

Next, reflection spectrum of the CuCl thin film 13 having the electron beam irradiation film thickness of 15 nm was measured. The measurement was performed in the same manner as in Example 1. In FIG. 7, the actual results of the measurement and theoretically-calculated reflection spectrum are illustrated. The theoretical calculation was carried out using the ABC-Free theory by contribution of $Z_3$ (n=1) exciton order.

As illustrated in FIG. 7, the results of the measurements of the reflection spectrum matched well with the theoretical calculation calculated assuming that the resonance portion (CuCl layer) of the CuCl thin film was 32 nm in thickness, a backside optical active layer (CuCl inactive layer) was 7 nm in thickness, the attenuation multiplier factor in an energy region of an energy of $E_T$ or less was $\Gamma_0$=0.1 meV, the attenuation multiplier factor in an energy region of an energy of $E_T$ or more increased linearly and reached 44 $\Gamma_0$ at 3.215 meV.

Therefore, it can be said that the CuCl thin film 13 was an optically excellent CuCl thin film with a small attenuation multiplier factor.

Figure 8:
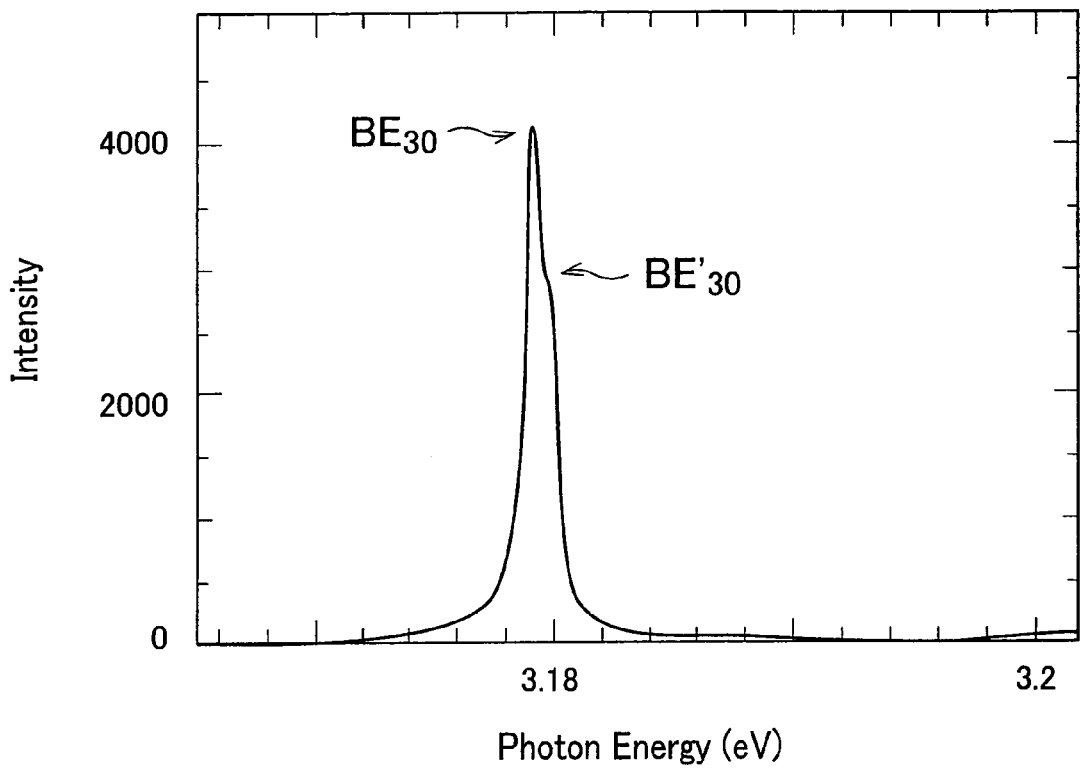
FIG. 8(a) is a graph illustrating results of emission spectrum measurement for the CuCl thin film according to the another Example of the present invention.
FIG. 8(b) is a graph of emission spectrum measurement results of a CuCl thin film formed in film thickness of 30 nm without electron beam irradiation.
Figure 8:
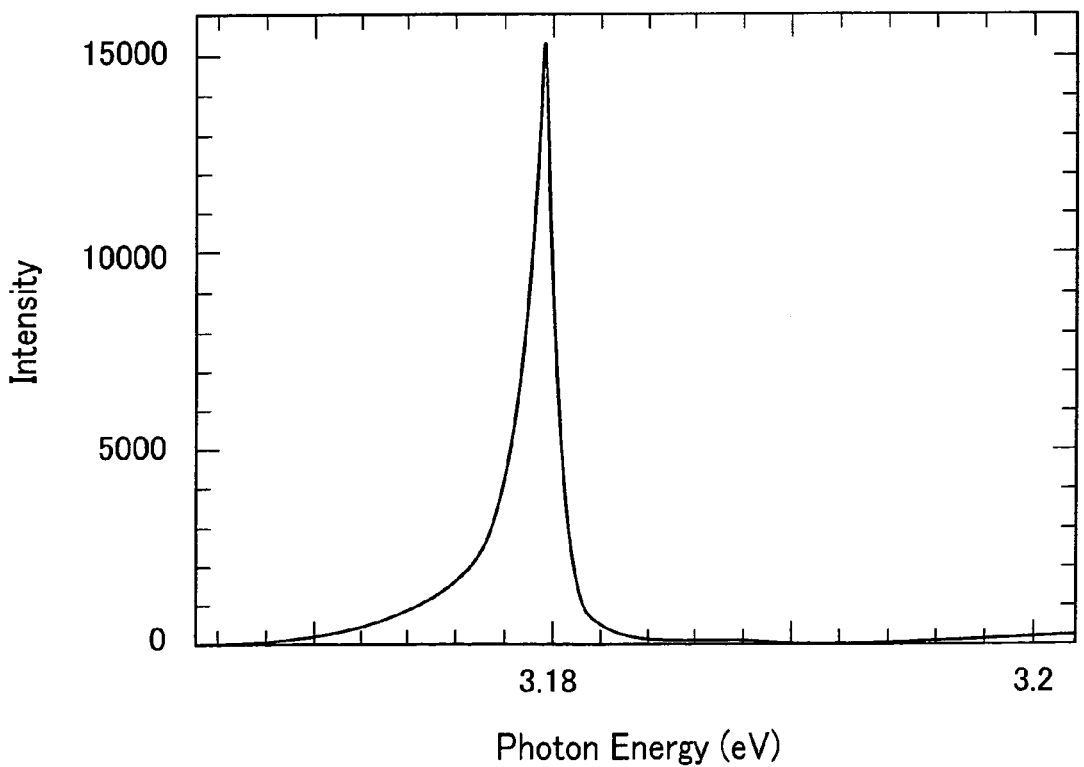

Emission spectrum of the CuCl thin film 13 was measured. The measurement was carried out in the same manner as in Example 1. FIG. 8(a) is a graph illustrating the results of the measurement of the emission spectrum of the CuCl thin film 13. Moreover, FIG. 8(b) is a graph illustrating results of measurement of emission spectrum of the CuCl thin film of 30 nm film thickness formed without the electron beam irradiation.

As illustrated in FIG. 8(b), only one light emitting sharp peak due to the bound exciton was observed in the CuCl thin film formed without the electron beam irradiation. On the other hand, as illustrated in FIG. 8(a), the CuCl thin film 13 showed, due to the bound exciton, a "shoulder" ($BE'_{30}$ in FIG. 8(a)) on the right side of the emission peak ($BE_{30}$ in FIG. 8(a)) that appeared on the lower-energy side due to the electron beam irradiation.

In the CuCl thin film 1 in Example 1, the new peak ("shoulder") $BE'_{65}$ due to the electron beam irradiation appeared on the lower-energy side of the emission peak $BE_{65}$ that occurred due to the bound exciton. On the other hand, in the CuCl thin film 13, the emission peak ("shoulder") $BE'_{30}$ due to the bound exciton appeared on the higher-energy side of the peak $BE_{30}$ that occurred due to the electron beam irradiation.

It is considered that this phenomenon occurred because, as the thickness of the electro beam irradiation film shared more in the whole CuCl thin film thickness, a ratio of (a) excitons trapped by the defects caused by the electron beam irradiation over (b) the excitons trapped by the defects occurred in the portion formed without the electron beam irradiation was increased.

Therefore, it is expected that the intensity of the peak caused by the bound exciton varies depending on the ratio of the thickness of the electro beam irradiation film over the whole CuCl thin film thickness. This can be a significant factor for deciding the whole CuCl thin film thickness and the thickness of the electro beam irradiation film.

As described above, on the contrary to the CuCl thin film conventionally formed without the electron beam irradiation, the process according the present Example for producing the CuCl thin film 13 can improve the resultant CuCl thin film 13 to have a surface whose roughness is reduced to the order of 2 nm, thereby making it possible to form an excellent super flat single crystal film. That is, the process according the present Example can realize an approximately 30 nm thickness CuCl thin film that is excellent in planarity and crystallinity.

On the other hand, the CuCl thin film is theoretically expected that the internal electric field is resonance-increased most significantly with the film thickness of approximately 30 nm (more specifically 26 nm). Thus, the process according to the present Example for producing the CuCl thin film 13 can realize a CuCl thin film having significantly excellent optical non-linearity and response speed. Moreover, the CuCl thin film 13 can be laminated to include a light guide.

The intensity of the peak caused by the bound exciton due to the electron beam irradiation varies depending on a ratio of (a) the film thickness of the layer grown with the electron beam irradiation over (b) the film thickness of the layer grown without the electron beam irradiation. Thus, it is possible to form a CuCl thin film with a greater optical non-linearity by appropriately changing, in consideration of the necessary film thickness of the whole CuCl thin film, the film thickness of the layer to be grown with the electron beam irradiation.

The film thickness of the CuCl thin film may be adjusted as desired, even though the CuCl thin films 10 to 15 produced in the present Example were 30 nm in film thickness. For example, the CuCl thin film may have a film thickness of 26 nm with which the internal electric field is most significantly increased theoretically.

Moreover, the Examples explained above may be arranged such that the electron beam is irradiated over the whole area on the substrate, or such that the electron beam is irradiated onto a particular position on the substrate. That is, the CuCl thin film may be grown with the electron beam irradiated partly on a region of the CuCl thin film, while growing the rest region of the CuCl thin film without irradiating the electron beam thereon, when viewing the substrate in a direction vertical to its surface. With this arrangement, it is possible to produce the CuCl thin film arbitrarily surface-modifying one portion and not surface-modifying the other portion on one substrate.

Moreover, as described above, the CuCl thin film formed with the electron beam irradiation shows the peak of the emission spectrum at a different peak position compared with the CuCl thin film formed without electron beam irradiation. Thus, from the peak position, it is possible to obtain information of a CuCl thin film (it is possible to deduce properties of the CuCl thin film).

Furthermore, the present invention is not limited to the $CaF_2$ (111) substrate that is used in each Example described above. Instead of $CaF_2$ (111), it is possible to use a substrate made of another ionic single crystal material, that is, a material made of ionic crystal (a material formed with ionic bonds) that is single crystal (excellent in crystallinity). For example, the substrate may be made of a halogen metal such as an alkali halide or the like. Alternatively, the substrate may be made of an oxide such as sapphire, quartz, or the like. CuCl is optically responsive in the ultraviolet region (380 nm to 390 nm). Thus, it is preferable to use a substrate transparent in the ultraviolet region in order to attain wider application.

Moreover, it is not necessary to provide the $CaF_2$ buffer layer 3 even though the $CaF_2$ buffer layer 3 is provided in each Example described above. However, the distortion caused due to lattice mismatching between $CaF_2$ (111) layer 1 and the CuCl thin film can be absorbed and alleviated with the $CaF_2$ buffer layer 3. Furthermore, if the $CaF_2$ buffer layer 3 is provided, the defects occur mainly in this region (the $CaF_2$ buffer layer 3). This improves the CuCl thin film in quality. Thus, it is preferable that the $CaF_2$ buffer layer 3 be provided. Note that the buffer layer formed on the substrate is not limited to $CaF_2$, but is preferably a material that matches well with a lattice constant of a thin film formed on the buffer layer.

Moreover, the present invention is not limited to the formation method of the $CaF_2$ buffer layer 3 and the CuCl thin film in each Example in which the $CaF_2$ buffer layer 3 and the CuCl thin film were formed by the MBE method. For example, the $CaF_2$ buffer layer 3 and the CuCl thin film may be formed by any vapor-phase growth method such as a laser abrasion method, a plasma CVD method, or the like. Even when any of these methods is used, it is possible to form the thin film while irradiating the electron beam thereon so as to modify the crystal surface (factory of planarity and crystallinity).

Moreover, each Example was so arranged that CuCl, which is a strongly ionic material, was deposited. Electron numbers of constituting atoms are changed when electrons are kicked out or implement in due to the electron beam irradiation on a strongly ionic material. The change in the electron numbers of constituting atoms would alter bonding from ionic to covalent. That is, in each Example described above, the electron beam irradiation changes the way the atoms are bonded with each other, thereby improving the super thin film single crystal in planarity and crystallinity.

Moreover, the present invention is not limited to the Examples described above in which the CuCl thin film was formed as a group I-VII semiconductor single crystal thin film. For example, a metal halide semiconductor or the like may be formed as a group I-VII semiconductor single crystal thin film by a method substantially similar to the method described above. In this case, the conditions such as film thickness, deposition temperature, growth rate, growth method, or the like may be changed as suitable for the group I-VII semiconductor single crystal semiconductor to be formed. The film thickness at which the internal electric field resonance-increases is unique to each material. Thus, the film thickness of the whole film to be formed and the film thickness of the film to be formed with the electron beam irradiation be preferably decided in consideration of the group I-VII semiconductor single crystal semiconductor to be formed.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A group I-VII semiconductor single crystal thin film according to the present invention is excellent in planarity and crystallinity, and has a great optical non-linearity and fast response speed. Because of this, the group I-VII semiconductor single crystal thin film according to the present invention is applicable to an all-opt switch that controls light by using light. Application of such an all-opt switch to the optical communication technique makes it possible to realize an optical communication system that is faster than the conventional optical communication system. Moreover, the application of the group I-VII semiconductor single crystal thin film according to the present invention is not limited to the all-opt switch, and the group I-VII semiconductor single crystal thin film according to the present invention is applicable to any apparatus that utilizes the optical non-linearity.

The invention claimed is:

1. A group I-VII semiconductor single crystal thin film formed on a substrate made from ionic single crystals,
   the group I-VII semiconductor single crystal thin film being formed on a buffer layer while an electron beam is irradiated on the group I-VII semiconductor single crystal thin film, the buffer layer being for alleviating distortion caused due to a difference in lattice constant between the substrate and the group I-VII semiconductor single crystal thin film, and
   the group I-VII semiconductor single crystal thin film being a thin film of single composition and being a combination of a layer formed while irradiating the electron beam thereon and a layer formed while not irradiating the electron beam thereon;
   wherein an acceleration voltage HV of the electron beam is $0 \text{ (kV)} < HV \leq 30 \text{ (kV)}$;
   a filament current FI of the electron beam is $0 \text{ (A)} < FI < 5 \text{ (A)}$; and
   an irradiation current HI of the electron beam is $0 \text{ (A)} < HI \leq 150 \text{ (μA)}$.

2. The group I-VII semiconductor single crystal thin film as set forth in claim 1, having a film thickness that allows an internal electric field to be resonance-increased.

3. The group I-VII semiconductor single crystal thin film as set forth in claim 1, wherein:
   a region formed while irradiating an electron beam thereon and a region formed while not irradiating the electron beam thereon are located different places when viewing the substrate in a direction vertical to its surface.

4. The group I-VII semiconductor single crystal thin film as set forth in claim 1 being a CuCl thin film.

5. The group I-VII semiconductor single crystal thin film as set forth in claim 1 being a metal halide semiconductor thin film.

6. A process for producing a group I-VII semiconductor single crystal thin film on a substrate made from ionic single crystals, comprising:
   forming a buffer layer on the substrate, the buffer layer being for alleviating distortion caused due to a difference in lattice constant between the substrate and the group I-VII semiconductor single crystal thin film; and
   forming, on the buffer layer, the group I-VII semiconductor single crystal thin film of single composition, the group I-VII semiconductor single crystal thin film being a combination of a layer formed while irradiating the electron beam thereon and a layer formed while not irradiating the electron beam thereon;
   wherein an acceleration voltage HV of the electron beam is $0 \text{ (kV)} < HV \leq 30 \text{ (kV)}$;
   a filament current FI of the electron beam is $0 \text{ (A)} < FI < 5 \text{ (A)}$; and
   an irradiation current HI of the electron beam is $0 \text{ (μA)} < HI \leq 150 \text{ (μA)}$.

7. The process as set forth in claim 6, comprising:
   forming a layer of the group I-VII semiconductor single crystal thin film while irradiating an electron beam thereon; and
   forming the rest of the group I-VII semiconductor single crystal thin film while not irradiating the electron beam thereon.

8. The process as set forth in claim 6, wherein:
   the layer formed while irradiating the electron beam thereon and the layer formed while not irradiating the electron beam thereon have film thicknesses that are decided in consideration of a film thickness of the group I-VII semiconductor single crystal thin film, which is the combination of the layer formed while irradiating the electron beam thereon and the layer formed while not irradiating the electron beam thereon.

9. The process as set forth in claim 6, wherein:
   the film thickness of the group I-VII semiconductor single crystal thin film is a film thickness with which an internal electric field is resonance-increased.

10. The Group I-VII semiconductor single crystal thin film as set forth in claim 1, having a roughness in the order of 2 nm.

11. The process as set forth in claim 6, wherein the Group I-VII semiconductor single crystal thin film has a roughness in the order of 2 nm.

* * * * *